(12) United States Patent
Hara

(10) Patent No.: US 6,909,118 B2
(45) Date of Patent: Jun. 21, 2005

(54) SEMICONDUCTOR DEVICE AND METHOD OF FABRICATING THE SAME

(75) Inventor: Akito Hara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/790,875

(22) Filed: Mar. 2, 2004

(65) Prior Publication Data

US 2004/0183130 A1 Sep. 23, 2004

(30) Foreign Application Priority Data

Mar. 20, 2003 (JP) ........................................ 2003-077435
May 23, 2003 (JP) ........................................ 2003-146238

(51) Int. Cl.[7] ...................... H01L 29/04; H01L 31/036; H01L 29/76; H01L 31/112; H01L 27/01; H01L 27/12
(52) U.S. Cl. ............................. 257/72; 257/69; 257/350
(58) Field of Search ...................... 257/69–72, 350–351

(56) References Cited

U.S. PATENT DOCUMENTS 5,702,960 A * 12/1997 Moon ........................... 438/157
5,818,070 A * 10/1998 Yamazaki et al. ............. 257/72
2002/0031876 A1  3/2002 Hara et al. .................... 438/166

FOREIGN PATENT DOCUMENTS

| JP | 10-173192 | 6/1998 |
| JP | 2002-033481 | 1/2002 |

* cited by examiner

Primary Examiner—Cuong Nguyen
(74) Attorney, Agent, or Firm—Greer, Burns & Crain, Ltd.

(57) ABSTRACT

A TFT capable of showing a large gm (large ON-current) and having characteristics comparable to those of Si-MOSFET despite of its relatively simple configuration was fabricated by the steps of coating, for example, a positive photo-resist on an Mo film; subjecting the photo-resist to back light exposure from the glass-substrate side under masking with a bottom gate electrode, to thereby form a resist pattern having the same geometry and being aligned with the bottom gate electrode because exposure light is intercepted by the bottom gate electrode but can travel through the Mo film; and etching the Mo film under masking by the resist pattern to thereby form a top gate electrode in conformity with the geometry of the resist pattern in a self-aligned manner.

11 Claims, 15 Drawing Sheets

↓ CMP

↑—M

DIRECTION
OF LASER
SCANNING

↓ CMP

| S-value | 99mV/dec |
|---|---|
| $V_{th}$ | -0.73 (V) |

SEMICONDUCTOR DEVICE AND METHOD OF FABRICATING THE SAME

CROSS-REFERENCE TO RELATED APPLICATIONS

This application is based upon and claims the benefit of priority from the prior Japanese Patent Application Nos. 2003-077435, filed on Mar. 20, 2003 and 2003-146238, filed on May 23, 2003, the entire contents of which are incorporated herein by reference.

BACKGROUND OF THE INVENTION

1. Field of the Invention

The present invention relates to a semiconductor device and a method of fabricating the same, in particular to a thin film transistor (TFT) provided on an amorphous transparent substrate.

2. Description of the Related Art

In recent years, high-definition display has been realized by forming a polycrystalline semiconductor TFT (in particular polysilicon TFT (p-Si TFT) on an alkali-free glass substrate. In the most popular technique for forming a p-Si film which serves as an operative semiconductor film of the p-Si TFT, an amorphous silicon (a-Si) film is formed first, and the film is then irradiated with a UV short-pulse excimer laser light. This allows only the a-Si film to fuse and crystallize without adversely affecting the glass substrate, and thereby the p-Si film is obtained.

[Patent Document 1]
U.S. Patent Application Publication No. 2002/0031876A1
[Patent Document 2]
Japanese Patent Application Laid-Open No. 10-173192
[Patent Document 3]
Japanese Patent Application Laid-Open No. 2002-33481
[Non-Patent Document 1]
2001 AM-LCD p. 243

A high-power, linear-beam excimer laser adapted to wide-area irradiation has been used in order to form the p-Si film based on the above-described technique, and a top-gate-type thin film transistor using thus-crystallized, p-Si film has also been developed. In the excimer laser crystallization, crystal grains isotropically grow from randomly-generated nuclei, only to achieve a grain size of as small as less than 1 $\mu$m. This results in a large population of small-sized crystal grains in the channel region, and in a mobility of the TFT of typically as small as 150 cm$^2$/Vs or around. This value might be approximately 100 times larger than the mobility of a-Si MOSFET, but is approximately one-fourth of that of single-crystal silicon MOSFET (Si-MOSFET). The mobility will become larger in the channel portion having a larger grain size and a less amount of grain boundary extending along the direction of the length of the channel, and will become smaller in the channel portion having a smaller grain size and a larger amount of grain boundary extending along the direction of the length of the channel. The grain boundary has a lot of defects, and presence of the boundary within the channel portion will suppress the characteristics from being fully exhibited. In order to realize a high gm (large ON-current) with a polycrystalline semiconductor film, it is therefore necessary to increase the grain size, or to adopt some new design of TFT structure capable of achieving a high gm.

SUMMARY OF THE INVENTION

The present invention is conceived after considering the above-described problems, and an object thereof resides in providing a TFT capable of showing a large gm (large ON-current) and having characteristics comparable to those of Si-MOSFET despite of its relatively simple configuration, and a method of fabricating such TFT.

After extensive investigations, the present inventors conceived the following embodiments of the invention.

A semiconductor device of the present invention comprises an amorphous transparent substrate; an operative semiconductor film formed on the amorphous transparent substrate; and an upper gate electrode and a lower gate electrode composed of the same metal material, disposed on the amorphous transparent substrate, and formed on the upper side and lower side of the operative semiconductor film while respectively placing an insulating film in between; wherein the upper gate electrode and the lower gate electrode are different in the film thickness.

Another aspect of a semiconductor device of the present invention comprises an amorphous transparent substrate; an operative semiconductor film formed on the amorphous transparent substrate; and an upper gate electrode and a lower gate electrode disposed on the amorphous transparent substrate, and formed on the upper side and lower side of the operative semiconductor film while respectively placing an insulating film in between; wherein the upper gate electrode comprises a metal layer and a high-transmissivity material layer stacked thereon and having a larger transmissivity of light than the metal layer has; and the metal layer of the upper gate electrode and the lower gate electrode are composed of the same metal material but differ in the film thickness.

A method of fabricating a semiconductor device of the present invention comprises the steps of: depositing a metal material on an amorphous transparent substrate, and processing the metal material to thereby form a lower gate electrode; depositing a semiconductor film on the lower gate electrode while placing an insulating film in between, and processing the semiconductor film to thereby form an operative semiconductor film; and depositing the same metal material in a thickness smaller than that of the lower gate electrode, on the operative semiconductor film while placing an insulating film in between, and processing the metal material by light exposure from the back side of the amorphous transparent substrate under masking by the lower gate electrode, to thereby form an upper gate electrode aligned with the lower gate electrode.

Another aspect of a method of fabricating a semiconductor device comprising the steps of: depositing a metal material on an amorphous transparent substrate, and processing the metal material to thereby form a lower gate electrode; depositing a semiconductor film on the lower gate electrode while placing an insulating film in between, and processing the semiconductor film to thereby form an operative semiconductor film; and sequentially depositing, while placing an insulating film in between, the same metal material in a thickness smaller than that of the lower gate electrode, and a high-transmissivity material having a larger transmissivity of light than the metal material has, and processing the metal material and the high-transmissivity material by light exposure from back side of the amorphous transparent substrate under masking by the lower gate electrode, to thereby form an upper gate electrode aligned with the lower electrode.

The present invention is successful in realizing a TFT having characteristics comparable to those of Si-MOSFET, by combining a semiconductor film capable of realizing a large mobility and a double-gate structure using metal gates, provided on a transparent amorphous substrate.

DETAILED DESCRIPTION OF THE PREFERRED EMBODIMENTS

Basic Features of the Present Invention

Figure 1A:
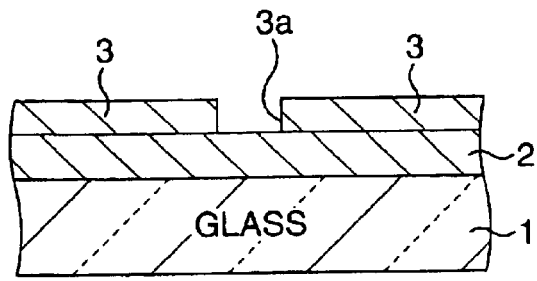
FIGS. 1A to 1D are schematic sectional views sequentially showing process steps of a method of fabricating a TFT according to a first embodiment of the present invention.

In pursuit of realizing a high-mobility TFT comparable to the Si-MOSFET, the present inventors conceived use of a polycrystalline semiconductor film as the operational semiconductor film, and adoption of a double-gate structure in which gate electrodes are disposed on the upper and lower sides of the operative semiconductor film while respectively placing an insulating film in between.

It is generally believed that the double-gate structure cannot be realized in Si-MOSFET using an Si substrate, because the upper and lower gate electrodes are very difficult to align. To realize thus-structured TFT, a TFT process based on use of a transparent amorphous substrate such as glass substrate is available. That is, a possible process is such as carrying out back exposure from the substrate side under masking by the lower gate electrode (bottom gate electrode) to thereby form the upper gate electrode (top gate electrode) in a self-aligned manner.

Asano et al. practically fabricated a TFT based on this technique (see Non-Patent Document 1: 2001 AM-LCD p. 243). The low-resistivity polysilicon gate was used in their experiments. The process is, however, not applicable to glass substrate because formation of the low-resistivity polysilicon film needs high temperature annealing. A quarts glass was their choice.

Another disclosed technique is such as forming the top gate electrode under masking by the bottom gate electrode in a self-aligned manner, which is enabled by using different materials for composing the bottom gate electrode and top gate electrode (see Patent Document: U.S. Pat. No. 2002/0031876A1).

It is, however, necessary for this case that the exposure light can travel through the substrate, can be intercepted at the portion of the bottom gate electrode, and can travel also through a conductive film composing the top gate electrode in the portion where the bottom gate electrode does not reside. To fulfill the requirements, it is allowable to form both gate electrodes using a metal material, where a metal layer intended for forming the top gate electrode is formed to as thin as allowing the exposure light to travel therethrough, and a metal layer intended for forming the bottom gate electrode is formed to as thick as intercepting the exposure light. Use of the same metal material for the bottom gate electrode and top gate electrode herein is successful in facilitating and ensuring interconnection of the both, in facilitating control of the threshold voltage, and in improving the characteristics. This makes it possible to obtain gm (mobility) twice as large as the general single-gate TFT. Use of the metal material for both gate electrodes also makes it possible to readily connect the both at a predetermined site.

To carry out the back exposure in an efficient and precise manner, it is preferable to form the conductive film intended for forming the top gate electrode to as thin as possible. On the other hand, the top gate electrode will undesirably have a larger resistance as the conductive film becomes thinner. To make a best balance between the requirements for the back exposure and reduction in the resistivity without sacrificing neither of the both, the present inventors conceived to configure the top gate electrode so as to have a stacked structure in which a metal layer composed of the same metal material with that composing the bottom gate electrode, and a high-transmissivity layer having a larger transmissivity of light than the metal layer has are stacked. That is, the requirement for the back exposure is satisfied by the metal layer thinner (as possible) than the bottom gate electrode, and the requirement for the reduction in the resistivity is satisfied by the high-transmissivity material layer represented by a transparent conductive material layer.

In addition in the formation by crystallization of the polycrystalline semiconductor film intended for forming the operative semiconductor film, a large-grain-size polysilicon can be formed by irradiating an energy beam having a time-dependent continuity. The resultant crystal grain size will reach as large as several micrometers. This crystal grain size is 10 times to 100 times larger than that attainable by the currently-available excimer laser crystallization. Also the mobility reaches 300 cm$^2$/Vs to 400 cm$^2$/Vs, which is twice or three times as large as that attainable by the excimer laser crystallization.

The TFT having characteristics comparable to those of Si-MOSFET can therefore be formed by combining the operative semiconductor film capable of realizing a large mobility with the double gate structure. The present invention is most appropriate for circuits formed on amorphous transparent substrates and expected for high-speed operation.

Specific Embodiments Applied with the Present Invention

Next paragraphs will detail specific embodiments of the present invention.

An exemplary process descried below adopts crystallization using a diode-pumped solid state (DPSS) laser as a CW (continuous wave) laser. The laser has a wavelength of 532 nm and an output of 10 W. Output instability of the energy beam is 0.1 rms % in noise, and the time-dependent instability of the output of ±1%/hour or less. The wavelength of the laser is by no means limited to the above-described value, and any other wavelengths capable of crystallizing the amorphous semiconductor film are available.

The amorphous transparent substrate used herein is typically NA35 glass, but the substrate material is not limited thereto, where other available examples include alkali-free glass, quartz glass and plastic.

(First Embodiment)

FIGS. 1A to 3D are schematic sectional views sequentially showing process steps of a method of fabricating a TFT according to a first embodiment of the present invention.

First as shown in FIG. 1A, on a glass substrate 1, a silicon oxide film 2 which will later become a buffer layer is formed to a thickness of 400 nm or around, a negative photo-resist, for example, is then coated thereon, and processed by photolithography to thereby form a resist pattern 3 having a groove pattern 3a in conformity with the geometry of the bottom gate electrode.

Figure 1B:
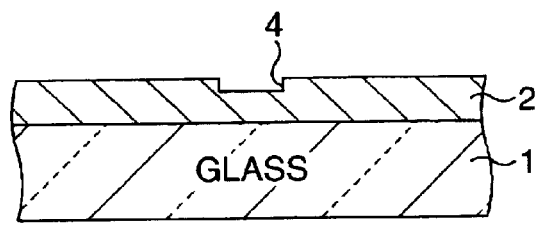

Next, as shown in FIG. 1B, the surficial portion of the silicon oxide film 2 is etched by RIE under masking by the resist pattern 3, to thereby form a groove 4 in conformance with the groove pattern 3a in the silicon oxide film 2 to a depth of 100 nm or around.

Figure 1C:
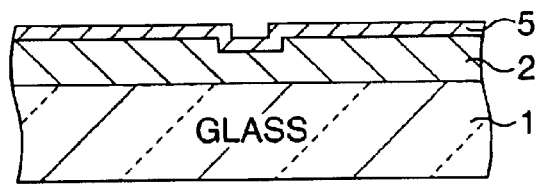

Next, as shown in FIG. 1C, a metal material, which is an Mo film 5 herein, is deposited typically by sputtering so as to fill the groove 4, to a thickness as thick as enough to intercept the exposure light (g line herein), which is 300 nm or around for example.

Figure 1D:
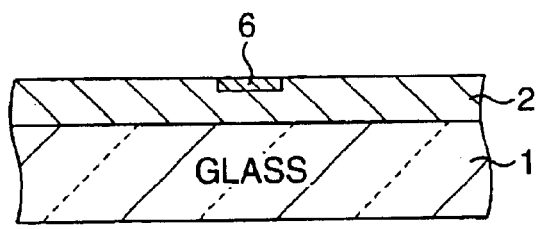

Next, as shown in FIG. 1D, the Mo film 5 is polished typically by chemical mechanical polishing (CMP) while using the silicon oxide film 2 as a stopper, so as to leave the Mo film 5 only in the groove 4 to thereby form a bottom gate electrode 6.

Figure 2A:
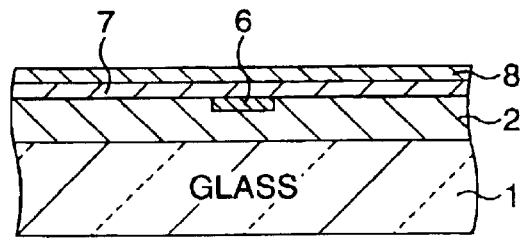
FIGS. 2A to 2D are schematic sectional views sequentially showing process steps of the method of fabricating a TFT according to the first embodiment of the present invention, as continued from FIG. 1D.

Next, as shown in FIG. 2A, a silicon oxide film is formed typically by the PECVD process on the bottom gate electrode 6 to a thickness of 60 nm or around, to thereby form a bottom gate insulating film 7, and further thereon, an amorphous silicon (a-Si) film 8 is formed to a thickness of 60 nm or around.

Figure 2B:
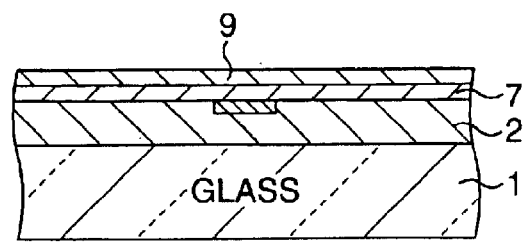
Figure 4:
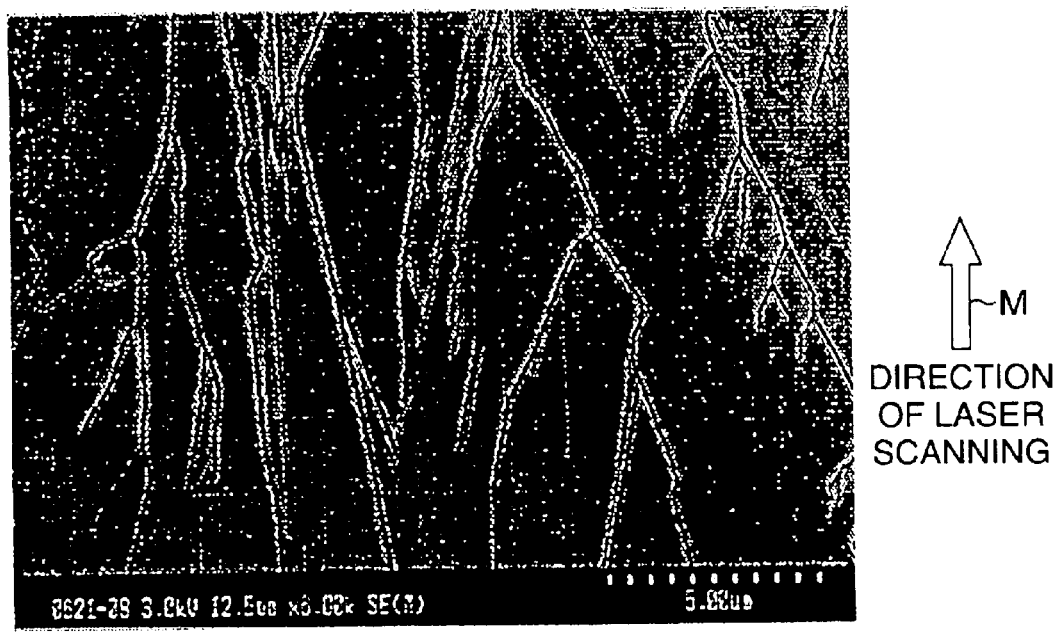
FIG. 4 is a microphotograph showing a flow pattern obtained by crystallization under scanning irradiation of CW laser.

Next, as shown in FIG. 2B, the a-Si film 8 is annealed to expel hydrogen contained therein, and then irradiated with an energy beam having a time-dependent continuity using a CW laser in a scanning manner, to thereby form a polysilicon film 9 having a large grain size. More specifically, as shown in FIG. 4, the polysilicon film 9 is formed so as to have a flow-patterned crystallinity characterized by a large streamline crystal grain, where the crystal grain is formed so that the crystal boundary thereof originates from the other front-positioned crystal grain and fuses with other crystal grain on the rear side, so that the crystal boundary runs nearly in parallel with the direction M of laser scanning, and so that the long axis of the crystal grain runs nearly in parallel with the direction connecting the source and the drain described later. The crystal grain size in this case is several micrometers or around, which is extremely large. This crystal grain size is 10 times to 100 times larger than that attainable by the currently-available excimer laser crystallization.

Figure 2C:
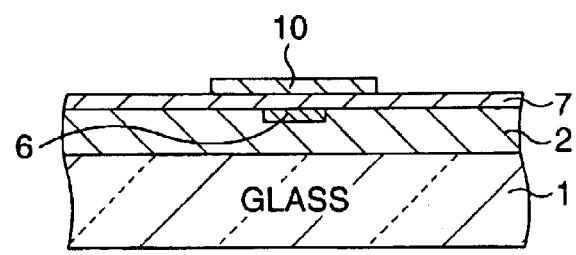
Figure 5:
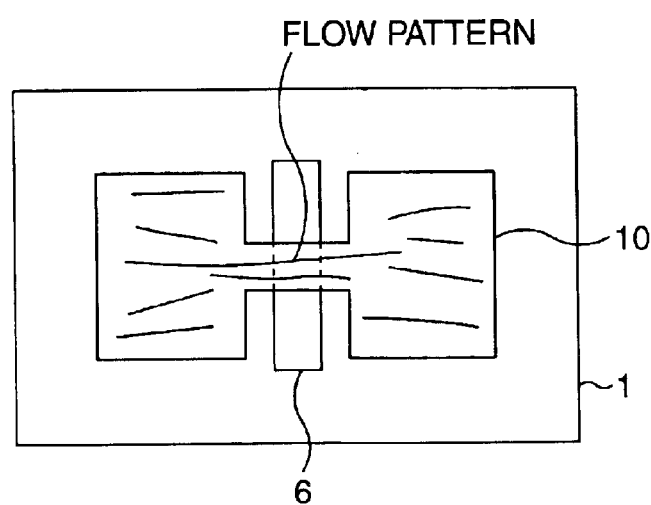
FIG. 5 is a schematic plan view of an operational semiconductor film patterned in an island form.

Next, as shown in FIG. 2C and FIG. 5, the p-Si film 9 is patterned to thereby form an operative semiconductor film 10 in an island form. Next, a portion (not shown) of the bottom gate insulating film 7 formed on the bottom gate electrode 6 is removed by etching so as to allow interconnection between the bottom gate electrode 6 and a top gate electrode described later.

Figure 2D:
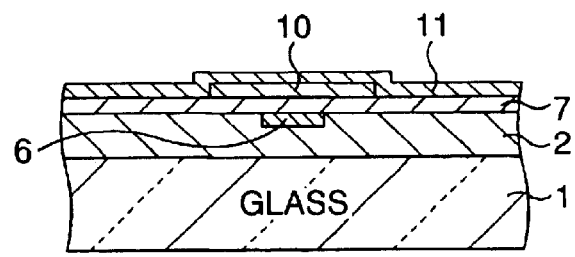

Next, as shown in FIG. 2D, a silicon oxide film is formed by the PECVD process so as to cover the operative semiconductor film 10 to a thickness of 60 nm or around, to thereby form a top gate insulating film 11. As descried in the above, it is preferable that the bottom gate insulating film and top gate insulating film are composed of the same insulating material.

Figure 3A:
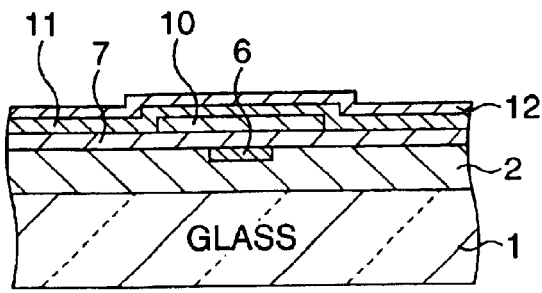
FIGS. 3A to 3D are schematic sectional views sequentially showing process steps of the method of fabricating a TFT according to the first embodiment of the present invention, as continued from FIG. 2D.

Next, in order to interconnect the bottom gate electrode 6 with a top gate electrode described later, a portion (not shown) of the top gate insulating film 11, which falls on the same position with the already-removed portion of the bottom gate insulating film 7, is removed by etching, and as shown in FIG. 3A, a metal material same with that composing the bottom gate electrode 6, which is an Mo film 12 herein, is formed by deposition on the top gate insulating film 11, to a thickness as thin as allowing the exposure light (g line herein) to pass therethrough, which is 50 nm or around for example. In this process, the bottom gate electrode 6 and Mo film 12 are connected through the aforementioned portion where the bottom gate insulating film 7 and top gate insulating film 11 are partially removed.

Figure 3B:
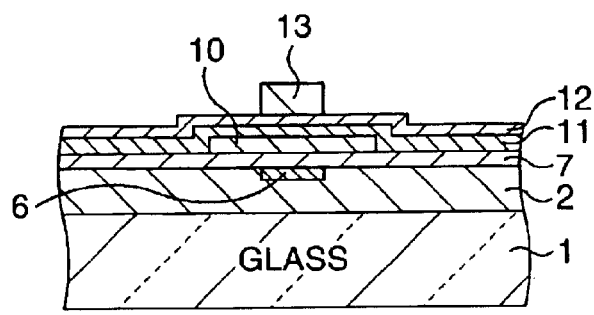

Next, as shown in FIG. 3B, a positive photo-resist, for example, is coated on the Mo film 12, and is then subjected to back exposure from the glass-substrate 1 side under masking by the bottom gate electrode 6. Because the exposure light is intercepted by the bottom gate electrode 6 but can travel through the Mo film 12, a resist pattern 13 having the same geometry and being aligned with the bottom gate electrode 6 can be formed.

Figure 3C:
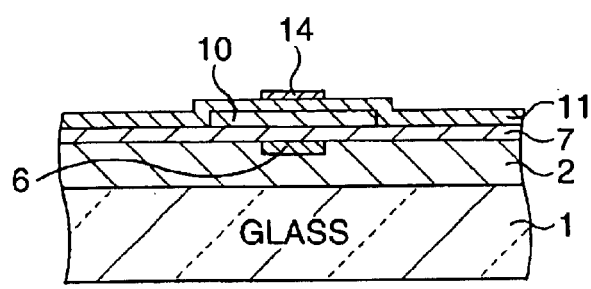

Next, as shown in FIG. 3C, the Mo film 12 is etched under masking by the resist pattern 13, to thereby form a top gate electrode 14 having a geometry in conformance with the resist pattern 13, in a self-aligned manner.

Figure 3D:
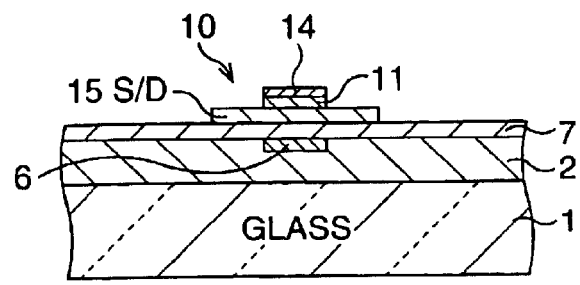

The resist pattern 13 is then removed by ashing or the like, and as shown in FIG. 3D, the top gate insulating film 11 is etched under masking by the top gate electrode 14. Next, the operative semiconductor film 10 is doped with an impurity, which is typically phosphorus ion, under masking by the top gate electrode 14. The operative semiconductor film 10 is then irradiated with excimer laser so as to activate phosphorus, to thereby form source and drain 15. It is to be noted that the activation of impurity is by no means limited to the excimer laser activation, and can be carried out also by thermal activation or lamp annealing.

An SiN is then deposited to a thickness of 300 nm or around so as to cover the entire surface, to thereby form an interlayer insulating film (not shown), which is followed by formation of contact holes, formation of metal electrodes (not shown) typically connected to the source and drain, and so forth. The TFT is thus completed.

It is preferable that the annealing temperature is set to 600° C. throughout the fabrication process of the TFT, because the temperature exceeding 600° C. results in deformation of the glass substrate 1.

As has been described in the above, this embodiment is successful in providing a TFT capable of showing a large gm (large ON-current) and having characteristics comparable to those of Si-MOSFET despite of its relatively simple configuration.

(Second Embodiment)

Figure 6A:
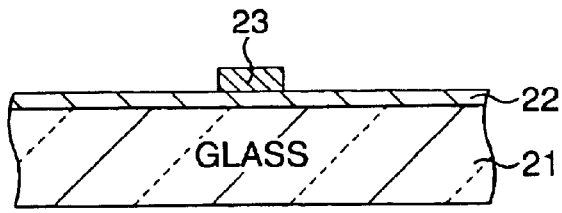
FIGS. 6A to 6D are schematic sectional views showing process steps of a method of fabricating a TFT according to a second embodiment of the present invention.
Figure 6B:
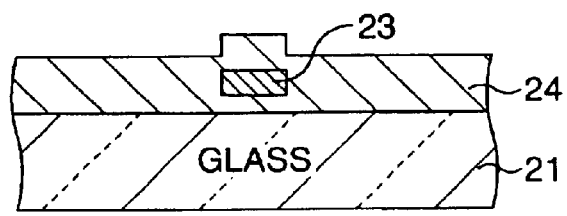
Figure 6C:
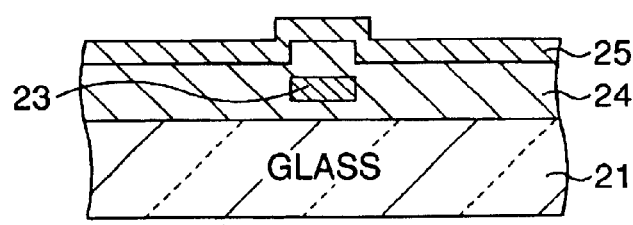
Figure 6D:
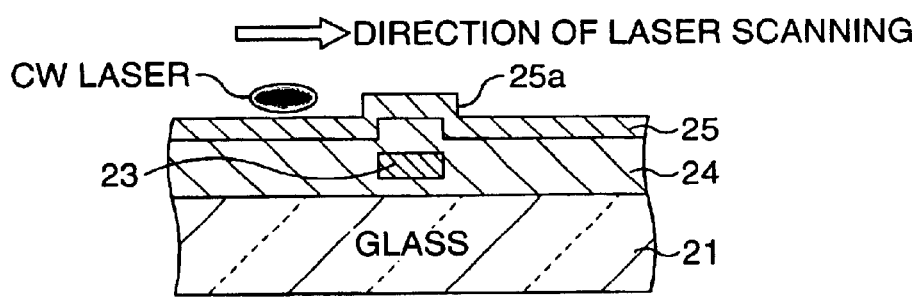
Figure 7A:
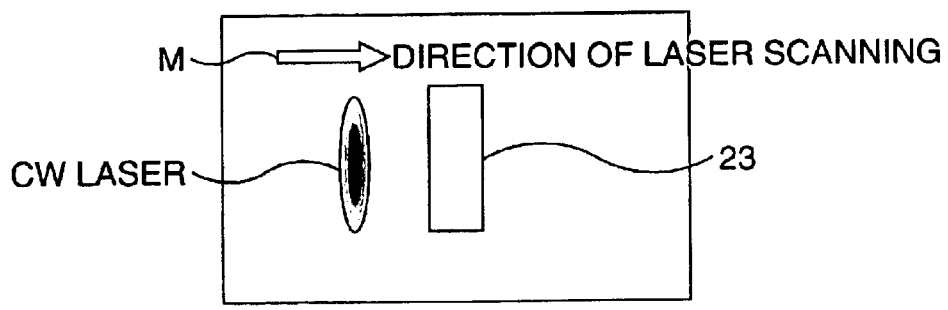
FIGS. 7A to 7D are schematic drawings showing process steps of the method of fabricating a TFT according to the second embodiment of the present invention, as continued from FIG. 6D.
Figure 7B:
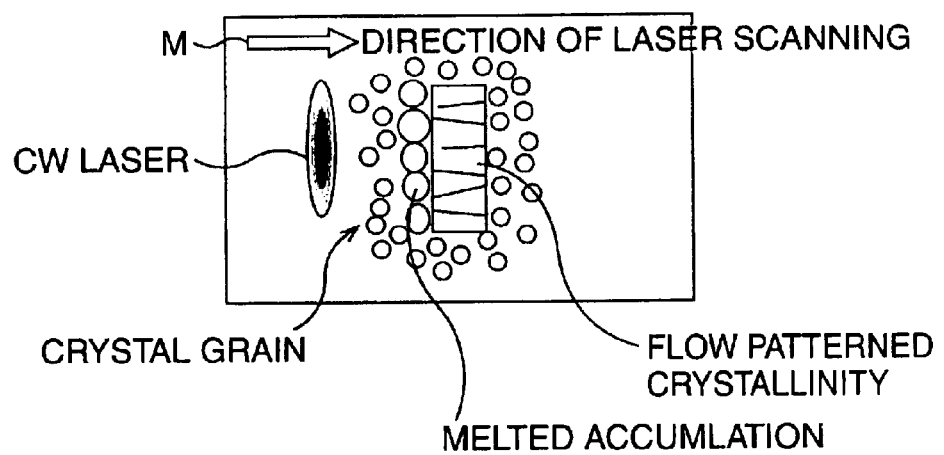
Figure 7C:
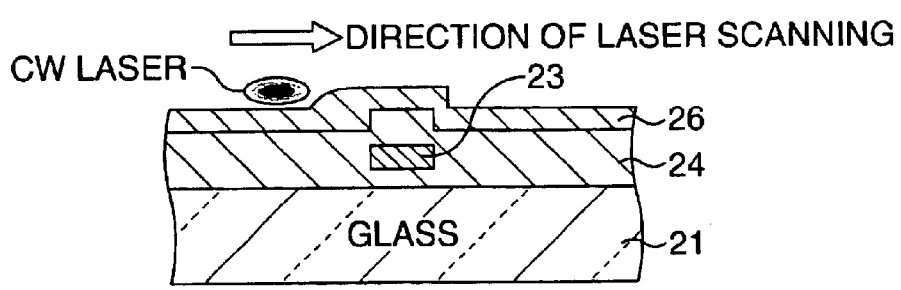
Figure 7D:
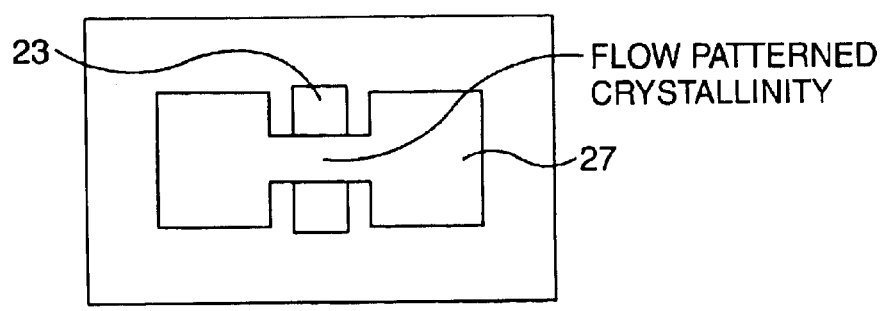

FIG. 6A to FIG. 8D are schematic drawings showing process steps of the method of fabricating a TFT according to the second embodiment, where FIGS. 6A to 6D, FIG. 7C and FIGS. 8A to 8D are schematic sectional views, and FIGS. 7A, 7B and 7D are schematic plan views.

First as shown in FIG. 6A, on a glass substrate 21, a silicon oxide film 22 which will later become a buffer layer is formed to a thickness of 400 nm or around, a metal material, which is an Mo film herein, is then formed by deposition to a thickness as thick as enough to intercept the exposure light (g line herein), which is 200 nm or around for example, and the Mo film is then patterned to thereby form a bottom gate electrode 23.

Next, as shown in FIG. 6B, a silicon oxide film 24 is formed typically by the PECVD process so as to cover the bottom gate electrode 23, to a thickness of 60 nm or around.

Next, as shown in FIG. 6C, an amorphous silicon (a-Si) film 25 is formed on the silicon oxide film 24 to a thickness 60 nm or around.

Next, as shown in FIGS. 6D and 7A, the a-Si film 25 is annealed to expel hydrogen contained therein, and then irradiated with an energy beam having a time-dependent continuity using a CW laser in a scanning manner.

In more detail, as shown in FIGS. 7B and 7C, the a-Si film 25 has a projected portion 25a on the bottom gate electrode 23 in conformance with the geometry thereof, and within the projected portion 25a the flow-patterned crystal as shown in FIG. 4 is formed. The flow-patterned crystal grains are formed on the bottom gate 23 without the melted film peeling off, even at the edge of the terrace of the projected portion 25a. This results in formation of a polysilicon (p-Si) film 26 having a large polysilicon crystal grain.

Next, as shown in FIG. 7D, the p-Si film 26 is patterned to thereby form an operative semiconductor film 27 in an island form. Next, a portion (not shown) of the silicon oxide film 24 formed on the bottom gate electrode 23 is removed by etching so as to allow interconnection between the bottom gate electrode 23 and a top gate electrode described later.

Figure 8A:
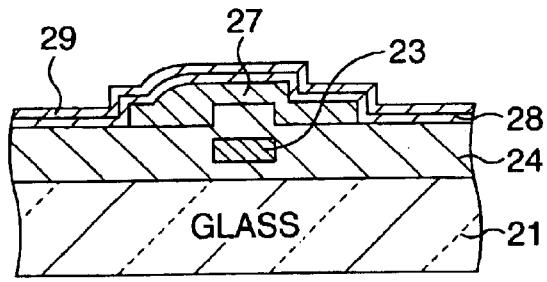
FIGS. 8A to 8D are schematic sectional views showing process steps of the method of fabricating a TFT according to the second embodiment of the present invention, as continued from FIG. 7D.

Next, as shown in FIG. 8A, a silicon oxide film is formed to a thickness of 60 nm or around, to thereby form an insulating film 28. Next, in order to interconnect the bottom gate electrode 23 with a top gate electrode described later, a portion (not shown) of the gate insulating film 28, which falls on the same position with the already-removed portion of the silicon oxide film 24, is removed by etching, and a metal material same with that composing the bottom gate electrode 23, which is an Mo film 29 herein, is formed by deposition on the gate insulating film 28, to a thickness as thin as allowing the exposure light (g line herein) to pass therethrough, which is 50 nm or around for example. In this process, the bottom gate electrode 23 and Mo film 29 are connected through the aforementioned portion where the silicon oxide film 24 and gate insulating film 28 are partially removed.

Figure 8B:
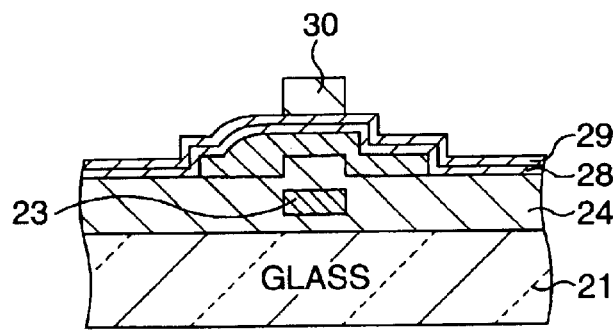

Next, as shown in FIG. 8B, a positive photo-resist, for example, is coated on the Mo film 29, and is then subjected to back exposure from the glass-substrate 21 side under masking by the bottom gate electrode 23. Because the exposure light is intercepted by the bottom gate electrode 23 but can travel through the Mo film 29, a resist pattern 30 having the same geometry and being aligned with the bottom gate electrode 23 can be formed.

Figure 8C:
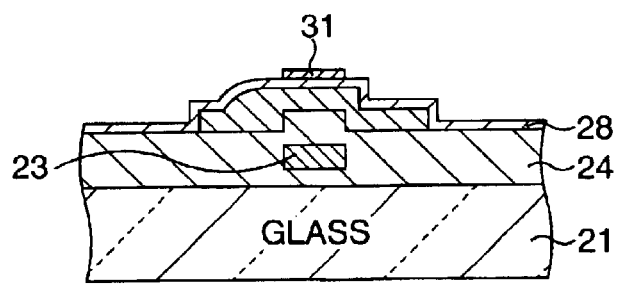

Next, as shown in FIG. 8C, the Mo film 29 is etched under masking by the resist pattern 30, to thereby form a top gate electrode 31 having a geometry in conformance with the resist pattern 30, in a self-aligned manner.

Figure 8D:
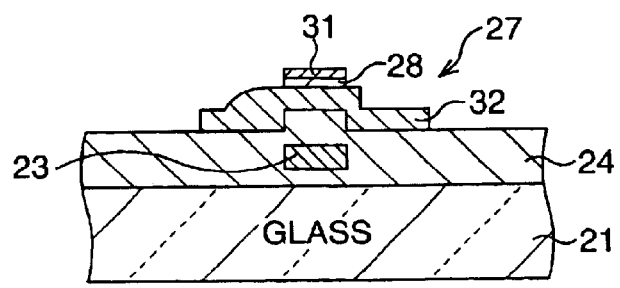

The resist pattern 30 is then removed by ashing or the like, and as shown in FIG. 8D, the gate insulating film 28 is etched under masking by the top gate electrode 31. Next, the operative semiconductor film 27 is then doped with an impurity, which is typically phosphorus ion, under masking by the top gate electrode 31. The operative semiconductor film 27 is then irradiated with excimer laser so as to activate phosphorus, to thereby form source and drain 32 on both sides of the top gate electrode 31. It is to be noted that the activation of impurity is by no means limited to the excimer laser activation, and can be carried out also by thermal activation or lamp annealing.

An SiN is then deposited to a thickness of 300 nm or around so as to cover the entire surface, to thereby form an interlayer insulating film (not shown), which is followed by formation of contact holes, formation of metal electrodes (not shown) typically connected to the source and drain, and so forth. The TFT is thus completed.

As has been described in the above, this embodiment is successful in providing a TFT capable of showing a large gm (large ON-current) and having characteristics comparable to those of Si-MOSFET despite of its relatively simple configuration.

In the first and second embodiments, a top gate electrode can be formed into a desired thickness in which a plurality of Mo films has are stacked, by executing the following steps ① to ③ several times over.

In step ①, an Mo film being the same metal material in a thickness smaller than that of the bottom gate electrode 23, on the operative semiconductor film 27 while placing the silicon oxide film 24 in between, is formed by deposition.

In step ②, a positive photo-resist, for example, is coated on the Mo film, and is then subjected to back exposure from the glass-substrate 21 side under masking by the bottom gate electrode 23, thereby a resist pattern having the same geometry and being aligned with the bottom gate electrode 23 is formed.

In step ③, the Mo film is etched under masking by the resist pattern.

(Third Embodiment)

FIG. 9A to FIG. 11D are schematic sectional views showing process steps of the method of fabricating a TFT according to the third embodiment. It is to be noted that constituents corresponding to those appeared in the first embodiment will have the same reference numerals for convenience sake.

Figure 9A:
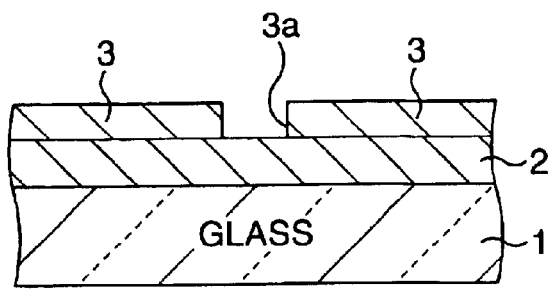
FIGS. 9A to 9D are schematic sectional views showing process steps of a method of fabricating a TFT according to a third embodiment of the present invention.

First as shown in FIG. 9A, on a glass substrate 1, a silicon oxide film 2 which will later become a buffer layer is formed to a thickness of 400 nm or around, a negative photo-resist, for example, is then coated thereon, and processed by photolithography to thereby form a resist pattern 3 having a groove pattern 3a in conformity with the geometry of the bottom gate electrode.

Figure 9B:
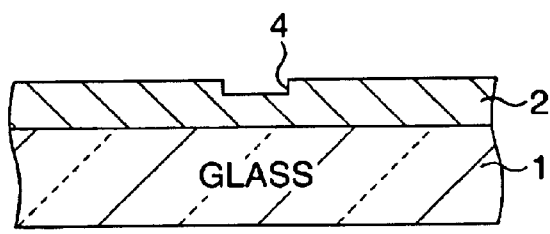

Next, as shown in FIG. 9B, the surficial portion of the silicon oxide film 2 is etched by RIE under masking by the resist pattern 3, to thereby form a groove 4 in conformance with the groove pattern 3a in the silicon oxide film 2 to a depth of 100 nm or around.

Figure 9C:
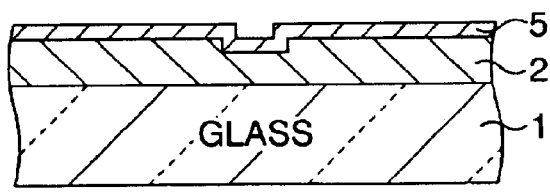

Next, as shown in FIG. 9C, a metal material, which is an Mo film 5 herein, is deposited typically by sputtering so as to fill the groove 4, to a thickness as thick as enough to intercept the exposure light (g line herein), which is 300 nm or around for example.

Figure 9D:
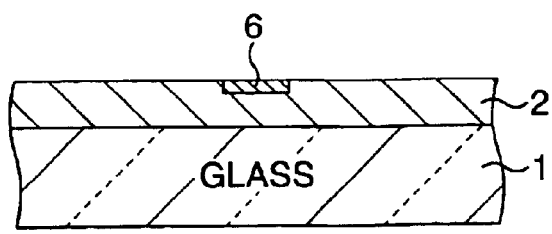

Next, as shown in FIG. 9D, the Mo film 5 is polished typically by chemical mechanical polishing (CMP) while using the silicon oxide film 2 as a stopper, so as to leave the Mo film 5 only in the groove 4 to thereby form a bottom gate electrode 6.

Figure 10A:
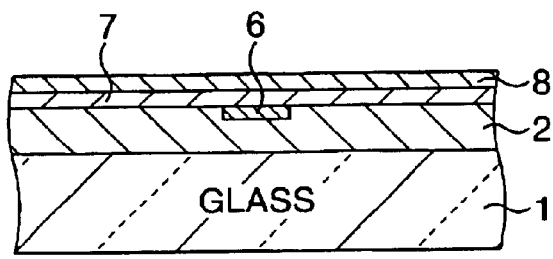
FIGS. 10A to 10D are schematic sectional views showing process steps of the method of fabricating a TFT according to the third embodiment of the present invention, as continued from FIG. 9D.

Next, as shown in FIG. 10A, a silicon oxide film is formed typically by the PECVD process on the bottom gate electrode 6 to a thickness of 60 nm or around, to thereby form a bottom gate insulating film 7, and further thereon, an amorphous silicon (a-Si) film 8 is formed to a thickness of 60 nm or around.

Figure 10B:
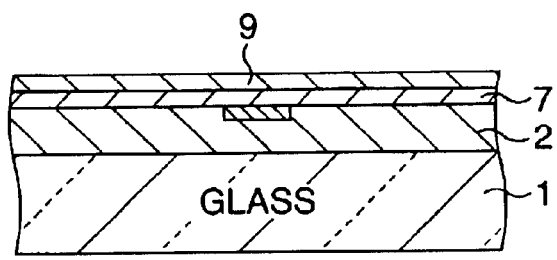

Next, as shown in FIG. 10B, the a-Si film 8 is annealed to expel hydrogen contained therein, and then irradiated with an energy beam having a time-dependent continuity using a CW laser in a scanning manner, to thereby form a polysilicon film 9 having a large grain size. More specifically, as shown in FIG. 4, the polysilicon film 9 is formed so as to have a flow-patterned crystallinity characterized by a large streamline crystal grain, where the crystal grain is formed so that the crystal boundary thereof originates from the other front-positioned crystal grain and fuses with other crystal grain on the rear side, so that the crystal boundary runs nearly in parallel with the direction M of laser scanning, and so that the long axis of the crystal grain runs nearly in parallel with the direction connecting the source and the drain described later. The crystal grain size in this case is several micrometers or around, which is extremely large. This crystal grain size is 10 times to 100 times larger than that attainable by the currently-available excimer laser crystallization.

Figure 10C:
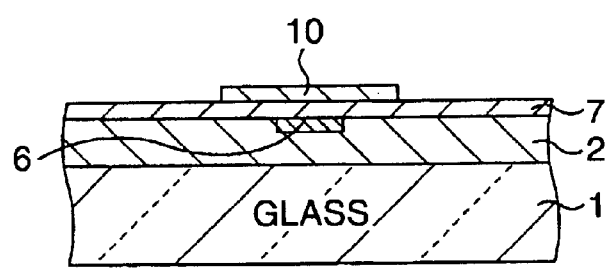

Next, as shown in FIG. 10C and FIG. 5, the p-Si film 9 is patterned to thereby form an operative semiconductor film 10 in an island form. Next, a portion (not shown) of the bottom gate insulating film 7 formed on the bottom gate electrode 6 is removed by etching so as to allow interconnection between the bottom gate electrode 6 and a top gate electrode described later.

Figure 10D:
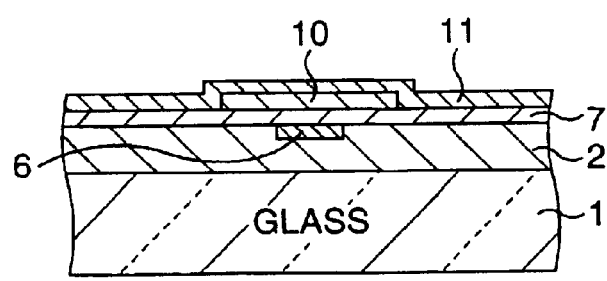

Next, as shown in FIG. 10D, a silicon oxide film is formed typically by the PECVD process on the bottom gate insulating film 7 so as to cover the operative semiconductor film 10 to a thickness of 60 nm or around, to thereby form a top gate insulating film 11. It is preferable to form the bottom gate insulating film and top gate insulating film using the same material.

Next, a portion (not shown) of the top gate insulating film 11, which falls on the same position with the already-removed portion of the bottom gate insulating film 7, is removed by etching, so as to allow interconnection between the bottom gate electrode 6 and a top gate electrode described later.

Next, a multi-layered top gate electrode, in which a metal layer and a high-transmissivity material layer having a larger transmissivity of light than the metal layer has are stacked, is formed.

Figure 11A:
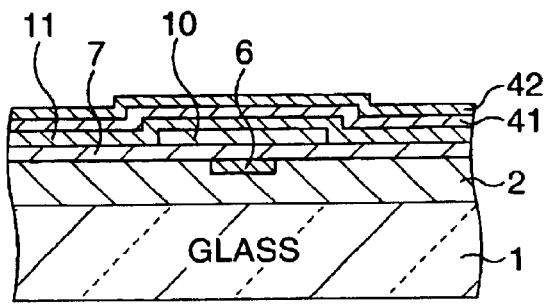
FIGS. 11A to 11D are schematic sectional views showing process steps of the method of fabricating a TFT according to the third embodiment of the present invention, as continued from FIG. 10D.

More specifically, first as shown in FIG. 11A, a metal material same as that composing the bottom gate electrode 6, which is an Mo film 41 herein, is formed by deposition on the top gate insulating film 11, to a thickness as thin as allowing the exposure light (g line herein) to pass therethrough, which is 50 nm or around for example. In this process, the bottom gate electrode 6 and Mo film 41 are connected through the aforementioned portion where the bottom gate insulating film 7 and top gate insulating film 11 are partially removed. Further on the Mo film 41, a high-transmissivity material, which is typically an ITO film 42 transparent to the exposure light, is formed by deposition to a thickness of 200 nm or around.

Figure 11B:
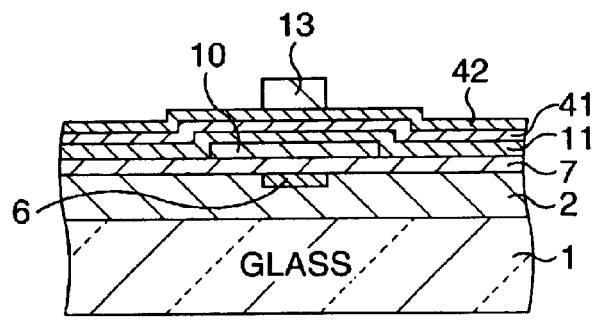

Next, as shown in FIG. 11B, a positive photo-resist, for example, is coated on the ITO film 42, and is then subjected to back exposure from the glass-substrate 1 side under masking by the bottom gate electrode 6. Because the exposure light is intercepted by the bottom gate electrode 6 but can travel through the Mo film 41 and ITO film 42, a resist pattern 13 having the same geometry and being aligned with the bottom gate electrode 6 can be formed.

Figure 11C:
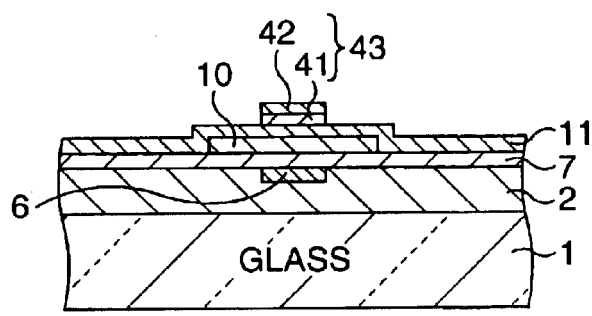

Then as shown in FIG. 11C, the Mo film 41 and ITO film 42 are etched under masking by the resist pattern 13, to thereby form a double-layered top gate electrode 43 having a geometry in conformance with the resist pattern 13, in a self-aligned manner.

Figure 11D:
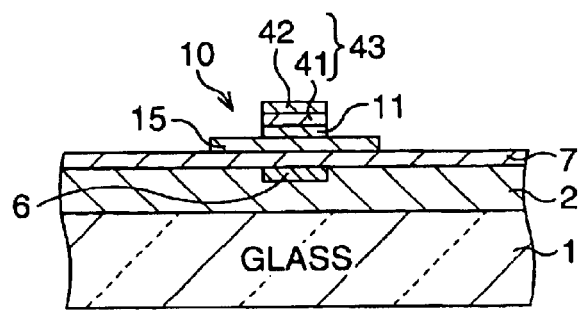

The resist pattern 13 is then removed by ashing or the like, and as shown in FIG. 11D, the top gate insulating film 11 is etched under masking by the top gate electrode 43 (Mo film 41 and ITO film 42). Next, the operative semiconductor film 10 is doped with an impurity, which is typically phosphorus ion, under masking by the top gate electrode 43. The operative semiconductor film 10 is then irradiated with excimer laser so as to activate phosphorus, to thereby form source and drain 15. It is to be noted that the activation of impurity is by no means limited to the excimer laser activation, and can be carried out also by thermal activation or lamp annealing.

An SiN is then deposited to a thickness of 300 nm or around so as to cover the entire surface, to thereby form an interlayer insulating film (not shown), which is followed by formation of contact holes, formation of metal electrodes (not shown) typically connected to the source and drain, and so forth. The TFT is thus completed.

It is preferable that the annealing temperature is set to 600° C. throughout the fabrication process of the TFT, because the temperature exceeding 600° C. results in deformation of the glass substrate 1.

As has been described in the above, this embodiment is successful in providing a TFT capable of showing a large gm (large ON-current) and having characteristics comparable to those of Si-MOSFET despite of its relatively simple configuration.

(Fourth Embodiment)

Figure 12A:
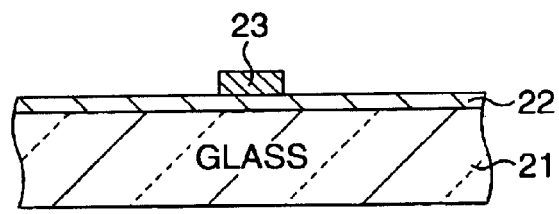
FIGS. 12A to 12D are schematic sectional views showing process steps of a method of fabricating a TFT according to a fourth embodiment of the present invention.
Figure 12B:
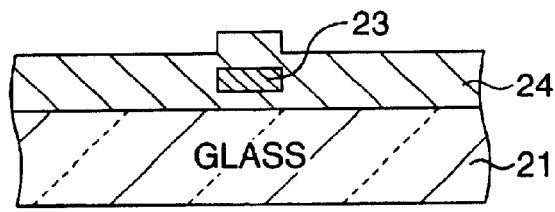
Figure 12C:
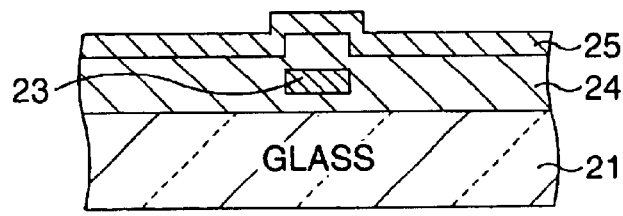
Figure 12D:
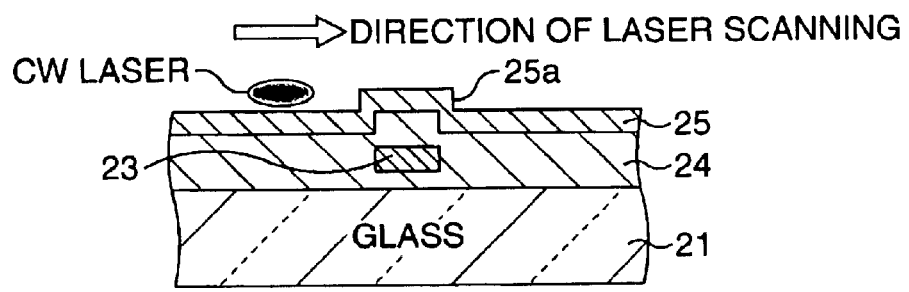
Figure 13A:
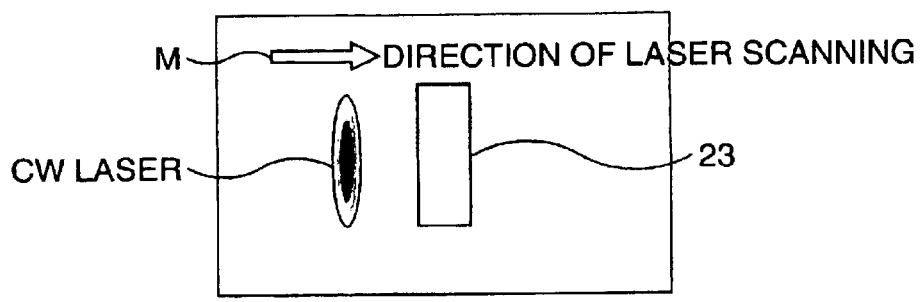
FIGS. 13A to 13D are schematic drawings showing process steps of the method of fabricating a TFT according to the fourth embodiment of the present invention, as continued from FIG. 11D.
Figure 13B:
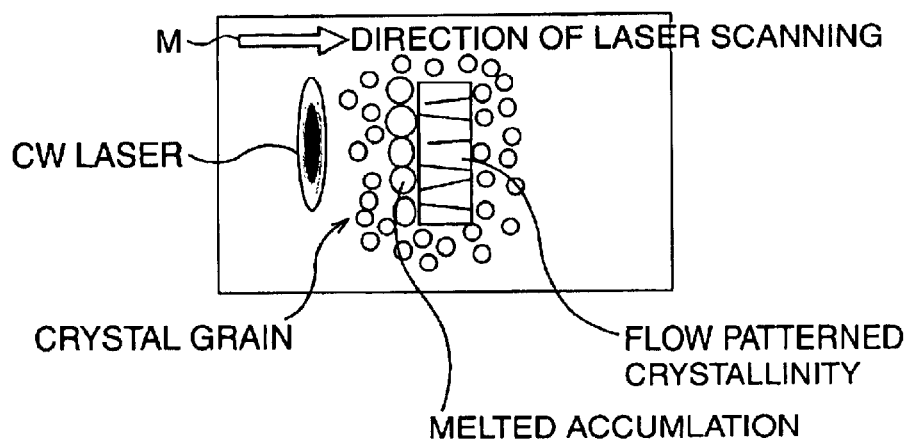
Figure 13C:
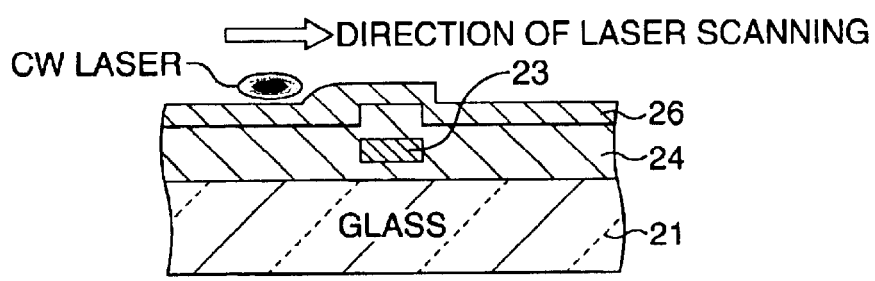
Figure 13D:
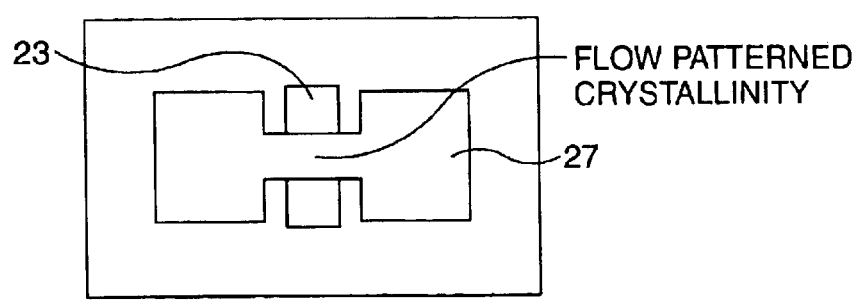

FIG. 12A to FIG. 14D are schematic drawings showing process steps of the method of fabricating a TFT according to the fourth embodiment, where FIGS. 12A to 12D, FIG. 13C and FIGS. 14A to 14D are schematic sectional views, and FIGS. 13A, 13B and 13D are schematic plan views. It is to be noted that constituents corresponding to those appeared in the second embodiment will have the same reference numerals for convenience sake.

First as shown in FIG. 12A, on a glass substrate 21, a silicon oxide film 22 which will later become a buffer layer is formed to a thickness of 400 nm or around, a metal material, which is an Mo film herein, is then formed by deposition to a thickness as thick as enough to intercept the exposure light (g line herein), which is 200 nm or around for example, and the Mo film is then patterned to thereby form a bottom gate electrode 23.

Next, as shown in FIG. 12, a silicon oxide film 24 is formed typically by the PECVD process so as to cover the bottom gate electrode 23, to a thickness of 60 nm or around.

Next, as shown in FIG. 12C, an amorphous silicon (a-Si) film 25 is formed on the silicon oxide film 24 to a thickness 60 nm or around.

Next, as shown in FIGS. 12D and 13A, the a-Si film 25 is annealed to expel hydrogen contained therein, and then irradiated with an energy beam having a time-dependent continuity using a CW laser in a scanning manner.

In more detail, as shown in FIGS. 13B and 13C, the a-Si film 25 has a projected portion 25a on the bottom gate electrode 23 in conformance with the geometry thereof, and within the projected portion 25a the flow-patterned crystal as shown in FIG. 4 is formed. The flow-patterned crystal grains are formed on the bottom gate 23 without the melted film peeling off, even at the edge of the terrace of the projected portion 25a. This results in formation of a polysilicon (p-Si) film 26 having a large polysilicon crystal grain.

Next, as shown in FIG. 13D, the p-Si film 26 is patterned to thereby form an operative semiconductor film 27 in an island form. Next, a portion (not shown) of the silicon oxide film 24 formed on the bottom gate electrode 23 is removed by etching so as to allow interconnection between the bottom gate electrode 23 and a top gate electrode described later.

Figure 14A:
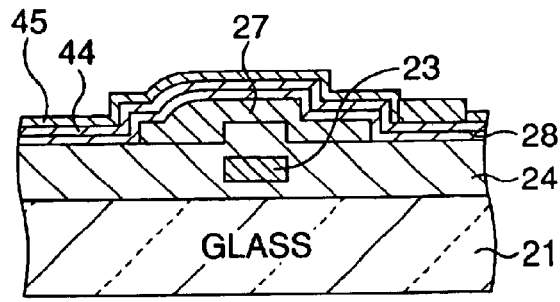
FIG. 14A to 14D are schematic sectional views showing process steps of the method of fabricating a TFT according to the fourth embodiment of the present invention, as continued from FIG. 13D.

Next, as shown in FIG. 14A, a silicon oxide film is formed to a thickness of 60 nm or around, to thereby form an insulating film 28. Next, in order to interconnect the bottom gate electrode 23 with a top gate electrode described later, a portion (not shown) of the gate insulating film 28, which falls on the same position with the already-removed portion of the silicon oxide film 24, is removed by etching.

Next, a multi-layered top gate electrode, in which a metal layer and a high-transmissivity material layer having a larger transmissivity of light than the metal layer has are stacked, is formed.

More specifically, a metal material same with that composing the bottom gate electrode 23, which is an Mo film 44 herein, is formed by deposition on the gate insulating film 28, to a thickness as thin as allowing the exposure light (g line herein) to pass therethrough, which is 50 nm or around for example. In this process, the bottom gate electrode 23 and Mo film 44 are connected through the aforementioned portion where the silicon oxide film 24 and gate insulating film 28 are partially removed. Further on the Mo film 44, a high-transmissivity material, which is typically an ITO film 45 transparent to the exposure light, is formed by deposition to a thickness of 200 nm or around.

Figure 14B:
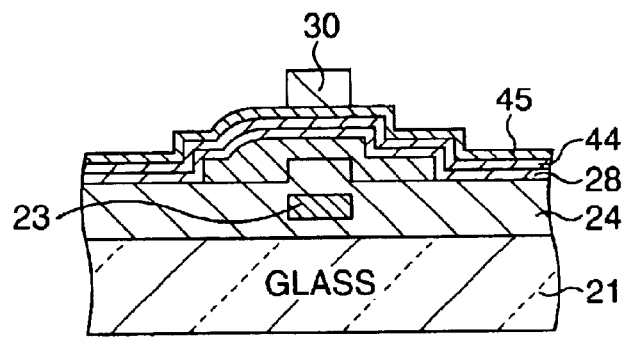

Next, as shown in FIG. 14B, a positive photo-resist, for example, is coated on the ITO film 45, and is then subjected to back exposure from the glass-substrate 21 side under masking by the bottom gate electrode 23. Because the exposure light is intercepted by the bottom gate electrode 23 but can travel through the Mo film 44 and ITO film 45, a resist pattern 30 having the same geometry and being aligned with the bottom gate electrode 23 can be formed.

Figure 14C:
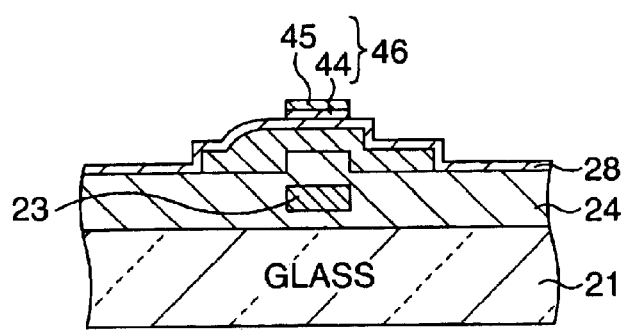

Next, as shown in FIG. 14C, the Mo film 44 and ITO film 45 are etched under masking by the resist pattern 30, to thereby form a double-layered top gate electrode 46 having a geometry in conformance with the resist pattern 30, in a self-aligned manner.

Figure 14D:
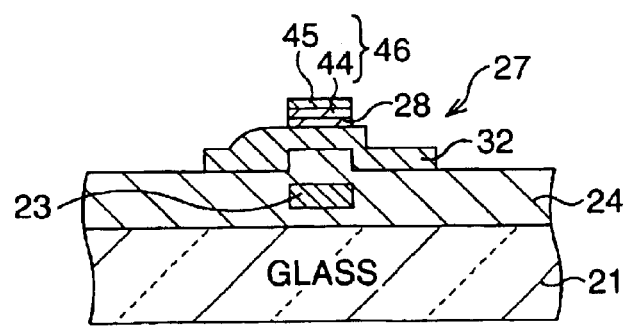

The resist pattern 30 is then removed by ashing or the like, and as shown in FIG. 14D, the gate insulating film 28 is etched under masking by the top gate electrode 46 (Mo film 44 and ITO film 45). Next, the operative semiconductor film 27 is doped with an impurity, which is typically phosphorus ion, under masking by the top gate electrode 46. The operative semiconductor film 27 is then irradiated with excimer laser so as to activate phosphorus, to thereby form source and drain 32 on both sides of the top gate electrode 46. It is to be noted that the activation of impurity is by no means limited to the excimer laser activation, and can be carried out also by thermal activation or lamp annealing.

An SiN is then deposited to a thickness of 300 nm or around so as to cover the entire surface, to thereby form an interlayer insulating film (not shown), which is followed by formation of contact holes, formation of metal electrodes (not shown) typically connected to the source and drain, and so forth. The TFT is thus completed.

Figure 15:
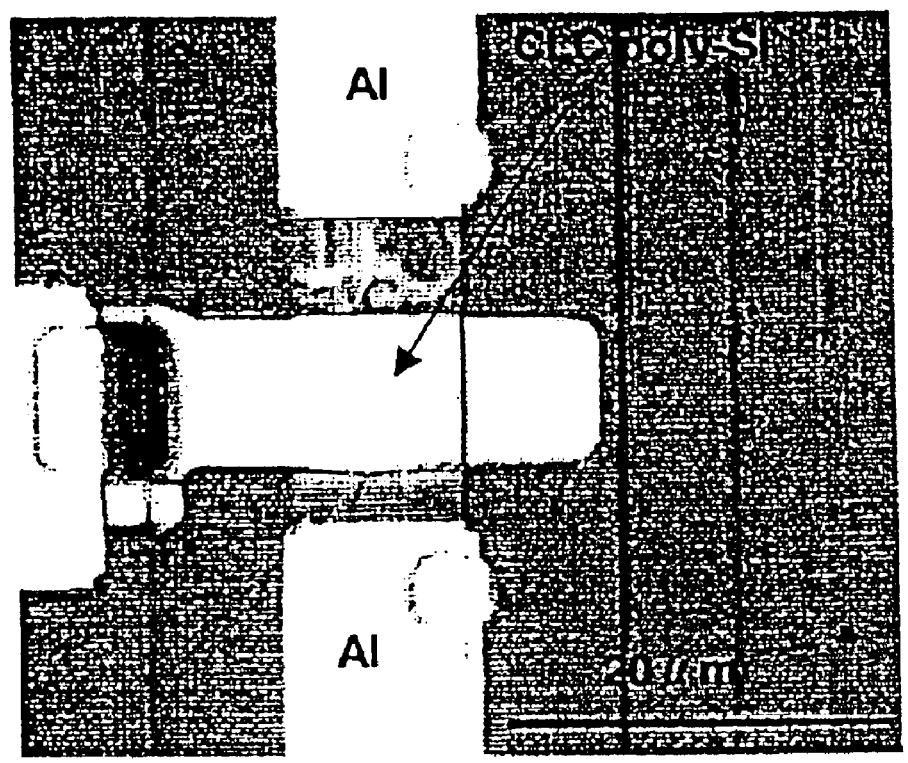
FIG. 15 is a microphotograph showing a TFT actually fabricated by the technique of the present invention.
Figure 16:
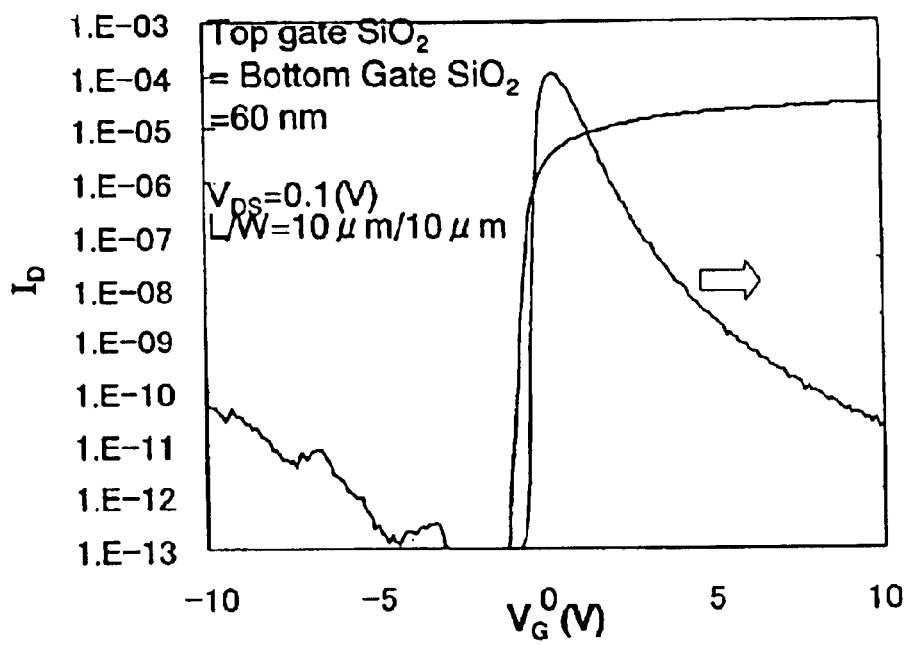
FIG. 16 is a characteristics chart of the TFT actually fabricated by the technique of the present invention.

A microphotograph and characteristics of the TFT actually fabricated according to the above-described method are shown in FIG. 15 and FIG. 16, respectively. In FIG. 16, the abscissa represents gate voltage $V_G$ (V), the left ordinate represents drain current $I_D$A, and the right ordinate represents mobility ($cm^2$/Vs) determined based on gm while assuming a top-gate-type TFT. It was found that an excellent TFT was obtained, showing a mobility of as extremely large as 800 $cm^2$/Vs, and an S value of as small as 100 mV/dec.

As has been described in the above, this embodiment is successful in providing a TFT capable of showing a large gm (large ON-current) and having characteristics comparable to those of Si-MOSFET despite of its relatively simple configuration.

What is claimed is:

1. A semiconductor device comprising:
    an amorphous transparent substrate;
    an operative semiconductor film formed on said amorphous transparent substrate; and
    an upper gate electrode and a lower gate electrode composed of the same metal material, disposed on said amorphous transparent substrate, and formed on the upper side and lower side of said operative semiconductor film while respectively placing an insulating film in between;
    wherein said upper gate electrode and said lower gate electrode are different in the film thickness.

2. The semiconductor device according to claim 1, wherein said upper gate electrode has a smaller film thickness than said lower gate electrode has.

3. A semiconductor device comprising:
    an amorphous transparent substrate;
    an operative semiconductor film formed on said amorphous transparent substrate; and
    an upper gate electrode and a lower gate electrode disposed on said amorphous transparent substrate, and formed on the upper side and lower side of said operative semiconductor film while respectively placing an insulating film in between;
    wherein said upper gate electrode comprises a metal layer and a high-transmissivity material layer stacked thereon and having a larger transmissivity of light than said metal layer has; and
    said metal layer of said upper gate electrode and said lower gate electrode are composed of the same metal material but differ in the film thickness.

4. The semiconductor device according to claim 3, wherein said high-transmissivity material layer of said upper gate electrode layer is composed of a transparent conductive material.

5. The semiconductor device according to claim 3, wherein said metal layer of said upper gate electrode is formed so as to have a smaller film thickness than said lower gate electrode has.

6. The semiconductor device according to claim 5, wherein said upper gate electrode and said lower gate electrode are formed so as to have an approximately equal gate length and so as to be aligned with each other.

7. The semiconductor device according to claim 1, wherein said lower gate electrode is buried in an insulating material, and said operative semiconductor film is formed in a planarized manner.

8. The semiconductor device according to claim 1, wherein said operative semiconductor film is formed so that the source/drain portion thereof is formed at a level lower than that of the channel portion thereof.

9. The semiconductor device according to claim 1, wherein said operative semiconductor film is composed of polysilicon.

10. The semiconductor device according to claim 9, wherein said operative semiconductor film is formed so as to have a flow-patterned crystallinity characterized by a large streamline crystal grain; and said crystal grain is formed so that the crystal boundary thereof originates from the other front-positioned crystal grain and fuses with other crystal grain on the rear side, and so that said crystal boundary runs nearly in parallel with the direction of laser scanning.

11. The semiconductor device according to claim 1, wherein said operative semiconductor film is formed in a thickness of 100 nm or less.

* * * * *